(12) United States Patent
Pei et al.

(10) Patent No.: US 10,749,005 B1
(45) Date of Patent: Aug. 18, 2020

(54) SEMICONDUCTOR DEVICE AND METHOD FOR MANUFACTURING THE SAME

(71) Applicant: DYNAX SEMICONDUCTOR, INC., Kunshan, Jiangsu Province (CN)

(72) Inventors: Yi Pei, Kunshan (CN); Feihang Liu, Kunshan (CN)

(73) Assignee: DYNAX SEMICONDUCTOR, INC., Kunshan, Jiangsu Province (CN)

( * ) Notice: Subject to any disclaimer, the term of this patent is extended or adjusted under 35 U.S.C. 154(b) by 0 days.

(21) Appl. No.: 16/080,223

(22) PCT Filed: Mar. 30, 2018

(86) PCT No.: PCT/CN2018/081392
§ 371 (c)(1),
(2) Date: Aug. 27, 2018

(87) PCT Pub. No.: WO2018/177426
PCT Pub. Date: Oct. 4, 2018

(51) Int. Cl.
*H01L 29/66* (2006.01)
*H01L 29/40* (2006.01)
*H01L 29/778* (2006.01)
*H01L 21/765* (2006.01)
*H01L 29/20* (2006.01)

(52) U.S. Cl.
CPC ......... *H01L 29/402* (2013.01); *H01L 21/765* (2013.01); *H01L 29/2003* (2013.01); *H01L 29/66462* (2013.01); *H01L 29/7786* (2013.01)

(58) Field of Classification Search
None
See application file for complete search history.

(56) References Cited

U.S. PATENT DOCUMENTS

| | | | | |
|---|---|---|---|---|
| 5,355,012 A | * | 10/1994 | Yamaguchi | ....... H01L 29/78612 257/347 |
| 2007/0002199 A1 | * | 1/2007 | Fujikawa | .......... G02F 1/136209 349/43 |
| 2007/0004116 A1 | * | 1/2007 | Hshieh | .................... H01L 24/26 438/197 |
| 2017/0104089 A1 | * | 4/2017 | Koezuka | ............. H01L 21/0217 |

* cited by examiner

*Primary Examiner* — Calvin Y Choi
(74) *Attorney, Agent, or Firm* — Armstrong Teasdale LLP

(57) ABSTRACT

The present disclosure provides a semiconductor device and a method for manufacturing the same. A semiconductor device according to a performing mode includes a substrate, a semiconductor layer located on one side of the substrate, a source and a drain located on one side of the semiconductor layer away from the substrate, and a gate located between the source and the drain, and an isolation structure disposed on one side of the semiconductor layer away from the substrate, one end of the isolation structure being disposed at a side close to the source, and the other end being disposed at a side close to the drain and in direct contact with the surface layer of the semiconductor device, the isolation structure covering the gate or a part of the gate, the isolation structure being an integrally formed structure and forming a chamber with the semiconductor layer.

16 Claims, 8 Drawing Sheets

SEMICONDUCTOR DEVICE AND METHOD FOR MANUFACTURING THE SAME

CROSS REFERENCE TO RELATED APPLICATIONS

This patent application is a National Stage Entry of PCT/CN2018/081392 filed on Mar. 30, 2018, which claims the benefit and priority of Chinese Patent Application No. 201710202132.6 filed on Mar. 30, 2017, the disclosures of which are incorporated herein by reference in their entirety as part of the present application.

BACKGROUND

The present disclosure relates to the technical field of semiconductor, and particularly relates to a semiconductor device and a method for manufacturing the same.

Gallium nitride HEMT (High Electron Mobility Transistor) is very suitable for producing devices of high temperature, high frequency, high voltage, and high power. It can be widely used in the field of radio frequency microwave and power electronics, and is one of research hotspots in the field of semiconductor devices. Regarding the HEMT device operating at high voltage, the electric field between the source and drain regions (especially in the region of the gate close to the drain) is very strong. Such a strong electric field may cause ionization of air and air vapor above the material surface, generate ions and thus affect the interface state change in the surface material of the device, cause a current collapse effect, affect the device performance, and thus affect the device operation reliability and reduce the device lifetime, so that the advantages of the HEMT device in high temperature, high voltage and high frequency cannot be fully exerted.

BRIEF DESCRIPTION

In view of the above, the present disclosure provides a semiconductor device and a method for manufacturing the same so as to avoid a current collapse effect and improve the high frequency performance of the device.

The technical solutions provided by the present disclosure are as follow:

A semiconductor device, including a substrate, a semiconductor layer located on one side of the substrate, a source and a drain located on one side of the semiconductor layer away from the substrate, and a gate located between the source and the drain, and an isolation structure disposed on one side of the semiconductor layer away from the substrate, one end of the isolation structure being disposed at a side close to the source, and the other end being disposed at a side close to the drain and in direct contact with the surface layer of the semiconductor device, the isolation structure covering the gate or a part of the gate, the isolation structure being an integrally formed structure and forming a chamber with the semiconductor layer, at least one part of the gate being located in the chamber, the chamber having an opening in a gate extending direction and forming a sealed chamber by sealing at the opening by a sealing structure.

Further, a height of the sealing structure is greater than a maximum height L of the isolation structure in a direction away from the semiconductor layer.

Further, one end of the isolation structure at a side close to the source forms an electrical connection with the source or the gate, and material of the isolation structure is a metallic material.

Further, one end of the isolation structure at a side close to the source is in direct contact with the source, and covers one side of the source away from the substrate.

Further, the isolation structure includes a plurality of isolation units, which are connected in turn and respectively cooperate with the semiconductor layer to form a plurality of chambers, and the gate or a part of the gate is located in one of the chambers.

Further, the isolation structure is set with at least one opening in a part above the gate.

Further, the semiconductor device further includes a first dielectric layer disposed on one side of the semiconductor layer away from the substrate.

Further, in the chamber, a sub-isolation structure located within the chamber is further disposed between the isolation structure and the gate, the sub-isolation structure cooperates with the semiconductor layer to form a sub-chamber, and the gate or a part of the gate is located within the sub-chamber.

Further, the sub-chamber is filled with a dielectric material to form a second dielectric layer.

The present disclosure further provides a method for manufacturing a semiconductor device, the method including providing a substrate, forming a semiconductor layer on one side of the substrate, forming a source and a drain on one side of the semiconductor layer away from the substrate, forming a gate between the source and the drain, forming an isolation structure on one side of the semiconductor layer away from the substrate, so that one end of the isolation structure is disposed at a side close to the source, and the other end is disposed at a side close to the drain and in direct contact with the surface layer of the semiconductor device, to cover the gate or a part of the gate, wherein the isolation structure is an integrally formed structure and forms a chamber with the semiconductor layer, and at least a part of the gate is located within the chamber, and disposing a sealing structure to seal an opening of the chamber in a gate extending direction to form a sealed chamber.

Further, prior to the step of forming a gate between the source and the drain, the method further includes forming a first dielectric layer on one side of the semiconductor layer away from the substrate, and forming a trench corresponding to the gate on the first dielectric layer to form the gate in the trench.

Further, the step of forming an isolation structure on one side of the semiconductor layer away from the substrate includes forming a support structure on one side of the semiconductor layer away from the substrate, the support structure covering at least one part of the gate, forming a shielding structure in a region of the semiconductor layer that is not covered by the isolation structure, integrally forming the isolation structure on the support structure so that the isolation structure covers the gate or a part of the gate, and removing the support structure and the shielding structure, and the step of disposing a sealing structure includes sealing an opening of the isolation structure at both ends in the gate extending direction with the sealing structure to seal a chamber formed between the isolation structure and the semiconductor layer.

Further, the step of forming a support structure on one side of the semiconductor layer away from the substrate includes depositing a second dielectric layer on the gate, forming a sub-isolation structure on the second dielectric layer, and forming the support structure on the sub-isolation structure.

Further, the isolation structure includes a plurality of isolation units, and the step of forming a support structure on one side of the semiconductor layer away from the substrate includes forming a plurality of support structures on one side of the semiconductor layer away from the substrate, wherein one of the support structures covers at least a part of the gate, and the step of forming the isolation structure on the support structure includes forming a plurality of isolation units connected in turn on a plurality of support structures to form the isolation structure.

Further, prior to the step of removing the support structure and the shielding structure, the method further includes forming at least one opening in a part of the isolation structure located above the gate.

In the embodiments of the present application, by disposing an isolation structure covering at least a part of the gate on the surface of the device, the isolation structure being an integrally formed structure, the isolation structure being in direct contact with the surface of the device between the gate and the drain and forming a chamber with the surface of the device, the chamber is sealed to form a sealed chamber with a very high sealability by a sealing structure, the outside air and water vapor can be well isolated, and the air and water vapor ionization on the material surface of the device under a strong electric field can be effectively avoided from inducing a current collapse effect. Furthermore, the thickness of the dielectric layer can be minimized when the dielectric layer is disposed on the interior surface of the isolation structure chamber. The gate and the isolation structure are isolated from the surface of the device by using air having a very small dielectric constant, which reduces the parasitic capacitance introduced by the dielectric layer when the dielectric layer is disposed, thereby effectively improving the parasitic capacitance effect and improving the high frequency characteristics of the device. The structure using such a semiconductor device has a simple manufacturing process and higher reliability.

In order to make the above features and advantages of the present disclosure more apparent, example embodiments will be hereinafter described in detail with reference to the accompanying drawings.

BRIEF DESCRIPTION OF THE DRAWINGS

In order to illustrate the technical solutions of the embodiments of the present disclosure more clearly, drawings to be used in the embodiments will be briefly described below. It should be appreciated that the following drawings are merely illustrative of some embodiments of the present disclosure and thus are not intended to limit the scope. Those ordinary skilled in the art can also obtain other related drawings according to these drawings without exercise of inventive skills.

DETAILED DESCRIPTION

Figure 1:
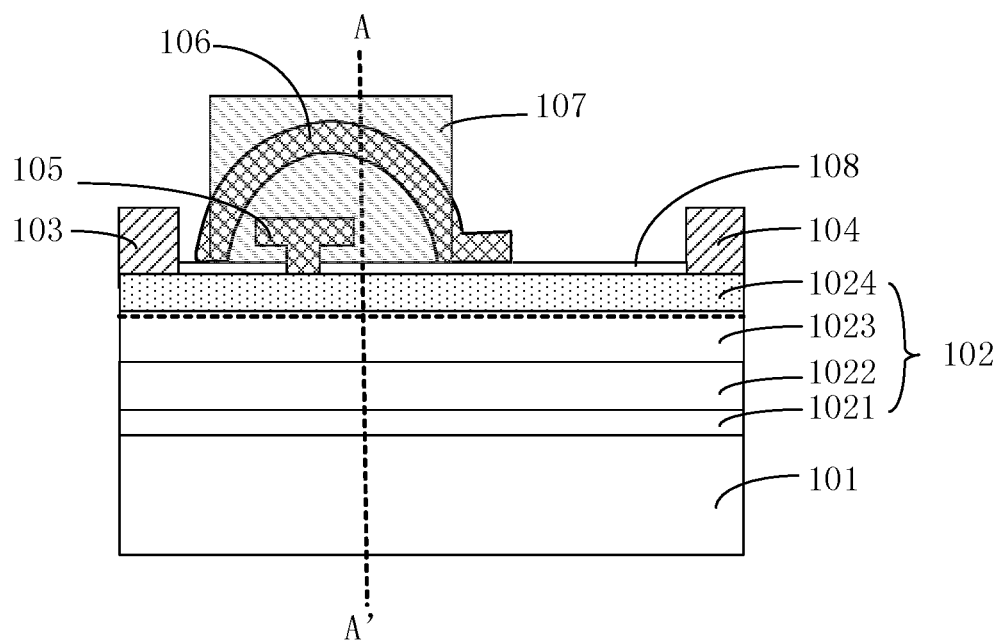
FIG. 1 is a cross-sectional schematic view of a semiconductor device at an opening of an isolation structure provided by an embodiment of the present disclosure.

The technical solutions in the embodiments of the present disclosure will be described in a clearly and fully understandable way in connection with the drawings related to the embodiments of the present disclosure. It is obvious that the described embodiments are just a part but not all of the embodiments of the disclosure. Generally, the components of the embodiments of the present disclosure described and showed in the accompanying drawings can be arranged and designed with various configurations. Thus, the detailed description of the embodiment showed in the accompanying drawing of the present disclosure is not for limiting the protection scope of the present disclosure but only for illustrating the selected preferred embodiment of the present disclosure. Based on the embodiment of the present disclosure, other embodiments obtained by those skilled in the art without exercise of inventive skills are also within the protection scope of the present disclosure.

It should be noted that similar reference numerals and letters refer to similar items in the following drawings, and thus once an item is defined in one drawing, it may not be further defined or explained in the subsequent drawings. Meanwhile, in the description of the present disclosure, terms such as "first" and "second" are used only for distinguishing the description, and should not be understood as indicating or implying to have importance in relativity.

In view of the problems existing in the prior art, a solution is to deposit the interface state of the dielectric layer passivation material on the material surface of the device, and to isolate the outside air and water vapor, where the thicker the dielectric layer, the better the isolation effect. However, the dielectric layer may introduce parasitic capacitance, and the thicker the dielectric layer, the greater the parasitic capacitance, which affects the high-frequency performance of the device, and the higher the operating frequency of the device, the more serious the effect.

In view of this, embodiments of the present application provide a semiconductor device 100, as shown in FIG. 1, including a substrate 101, a semiconductor layer 102, a source 103, a drain 104, a gate 105, and an isolation structure 106. It should be appreciated that the substrate 101 may be made of silicon carbide, sapphire, silicon, silicon on insulating substrate, gallium nitride, aluminum nitride, zinc oxide, or a combination thereof, or any other material capable of growing a group III nitride. The specific material of the substrate 101 is not limited in the embodiments of the present application.

The semiconductor layer 102 is located on a side of the substrate 101. In the embodiment of the present application, the semiconductor layer 102 may include a nucleation layer 1021, a buffer layer 1022, a channel layer 1023, and a barrier layer 1024. The nucleation layer 1021 can affect parameters such as crystal quality, surface morphology, and electrical properties of the heterojunction material thereabove, and the nucleation layer 1021 may change according to different materials of the substrate 101, while the nucleation layer 1021 functions primarily to match the material of the substrate 101 with the semiconductor material layer in the heterojunction structure. The buffer layer 1022 is located on one side of the nucleation layer 1021 away from the substrate 101, and the buffer layer 1022 is a transition layer between the nucleation layer 1021 and the channel layer 1023, functioning to match the material of the substrate 101 with a high quality epitaxial gallium nitride layer. The buffer layer 1022 may include a group III nitride material such as GaN, AlN, AlGaN, or AlGaInN. The channel layer 1023 is located on one side of the buffer layer 1022 away from the nucleation layer 1021, and the channel layer 1023 may include an undoped GaN layer. The barrier layer 1024 is located on one side of the channel layer 1023 away from the buffer layer 1022, and the barrier layer 1024 may include AlGaN or other nitrides. The channel layer 1023 and the barrier layer 1024 together constitute a semiconductor heterojunction structure, form two dimensional electron gas with a high concentration at the interface, and generate a conductive channel at the heterojunction interface of the channel layer 1023.

The source 103 and the drain 104 are located at two ends of the barrier layer 1024. The gate 105 is located between the source 103 and the drain 104, and the shape of the gate 105 may be T-shaped, gamma-shaped, or in other shapes. The shape of the gate 105 is not limited in the embodiments of the present application.

The isolation structure 106 is disposed on one side of the semiconductor layer 102 away from the substrate 101. One end of the isolation structure 106 is disposed at a side close to the source 103 and may form an electrical connection to the source 103 or the gate 105, and the other end is disposed at a side close to the drain 104 and is in direct contact with the surface layer of the device and forms a chamber. The surface layer of the device may be a semiconductor layer or a dielectric layer. The isolation structure 106 covers the gate 105 or a part of the gate 105. The isolation structure 106 is an integrally formed structure, and the isolation structure 106 cooperates with the semiconductor layer 102 or the dielectric layer 108 to form a chamber. At least a part of the gate 105 is located in the chamber.

Figure 2:
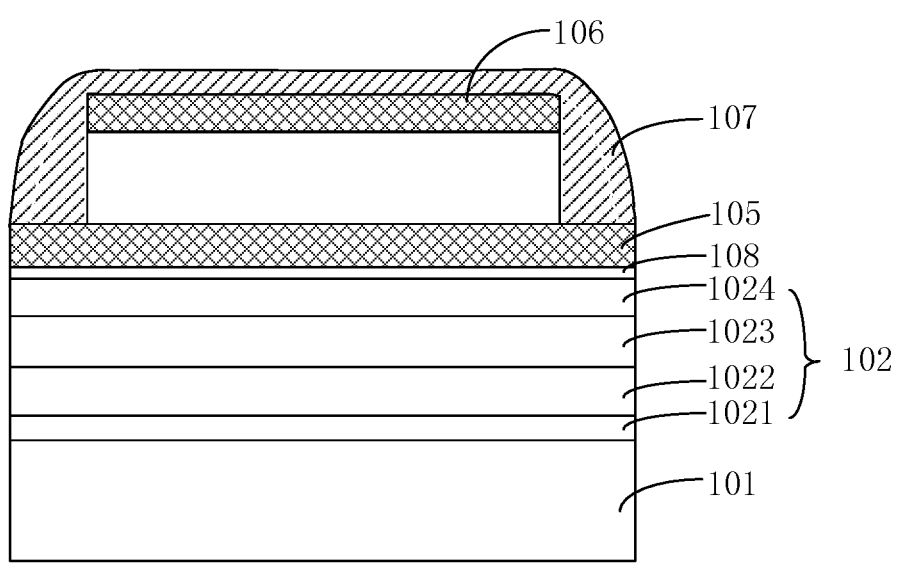
FIG. 2 is a cross-sectional schematic view of the semiconductor device along the line AN in FIG. 1.
Figure 3:
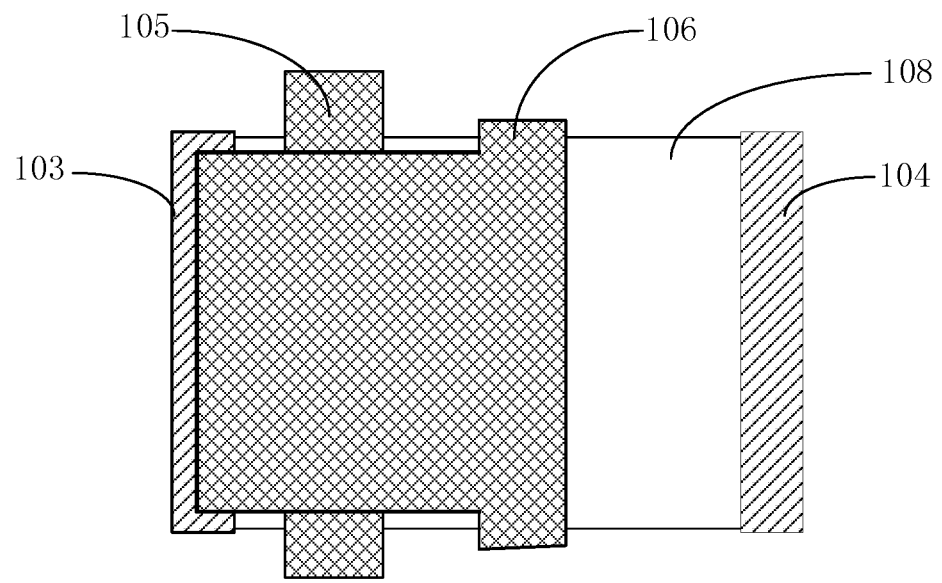
FIG. 3 is a schematic top view of the semiconductor device of FIG. 1.

As shown in FIG. 2, FIG. 2 is a cross-sectional schematic view of the semiconductor device 100 along the line AN in FIG. 1; in the view, the isolation structure 106 may not completely cover the gate 105, so that a part of the gate 105 is located in the chamber formed by the isolation structure 106 and the semiconductor layer 102. As shown in FIG. 3, FIG. 3 is a schematic top view of the semiconductor device 100. For ease of illustration, the sealing structure 107 is not shown in the schematic top view. It can be seen that the isolation structure 106 can cover only a part of the gate 105. Of course, in other embodiments, the isolation structure 106 can also cover the entire gate 105. The isolation structure 106 may cover 10%-100% of the gate 105 in the length direction of the gate 105.

It may be appreciated that the isolation structure 106 may be located above the gate 105, the gate source region (the region between the gate 105 and the source 103), and a part of the gate drain region (the region between the gate 105 and the drain 104). As such, a chamber is formed by the isolation structure 106, the gate 105, and the semiconductor layer 102 of the gate source region and the part of the gate drain region, and the chamber is sealed and isolated from the outside air. The structure of the isolation structure 106 may be integrally formed by an air bridge process, and when a metal material is used, it can be formed by a metal plating process, a metal electron beam evaporation process, a metal sputtering process, or a combination thereof. In the present disclosure, one end of the isolation structure 106 forms an electrical connection with the device electrode, and the other end is in direct contact with the surface layer of the device between the gate 105 and the drain 104. Such a structure adjusts dense electric field lines at the edge of the end of gate close to the drain, making the electric field line distribution more uniform, reducing the electric field at the edge of gate close to the end of the drain, reducing the gate leakage current, and increasing the device breakdown voltage. The isolation structure 106 may be an arch structure or the like, and the embodiment of the present application does not limit the specific structure of the isolation structure 106. In the case where one end of the isolation structure 106 forms an electrical connection with the source 103 and the other end is in direct contact with the device surface layer between the gate 105 and the drain 104, an arc structure may be used to ensure that the distances thereof in the vertical direction to the semiconductor layer 102 are not equal, and the isolation structure above the gate is further away from the gate, which is more effective in reducing the parasitic capacitance of the gate. In the case of use the arch structure, in order to ensure the robustness of the arch structure, the metal thickness may be in the range of about 1 μm to 5 μm. The isolation structure 106 may be made of a highly dense material such as a metal material, e.g. a metal material such as Ti, Al, Ni, Au, Pt, Ta, or a combination thereof. Generally, the strong electric field region on the material surface of the device is concentrated near the gate 105. In particular, the electric field at the end of metal of the gate 105 close to the drain is the strongest, and the air and water vapor in this part of region are most easily ionized to induce a current collapse effect. In the case that externally applied voltage is low, the sealed chamber structure covering only the local area can avoid the current collapse effect, and at the same time improve the robustness and reliability of the chamber.

The isolation structure 106 is provided with a sealing structure 107 at a port in the extending direction of the gate 105 to form a sealed chamber. When the isolation structure 106 is an arched structure, the maximum height between the apex and the device surface in the direction away from the semiconductor layer is L, and the height of the sealing structure 107 needs to be greater than the maximum height L of the isolation structure 106 in the direction away from the semiconductor layer. The height of the sealing structure 107 may be equal to or greater than 1.2L, which may more effectively ensure the sealing property of the arch isolation structure and the adhesion between the sealing structure 107 and the isolation structure 106, and avoid a problem of a decrease in airtightness which is caused when heat is generated in the device during operation. In addition, in the extending direction from the source 103 to the drain 104, as shown in FIG. 1, the distance between the inner walls of the isolation structure 106 in contact with the surface layer of the device is a, and the distance between the outer walls of the isolation structure in contact with the surface layer of the device is b, so the width of the sealing structure 107 in the direction extending from the source 103 to the drain 104 needs to be equal to or greater than (a+b)/2 to improve the sealing stability of the device during use.

Figure 4:
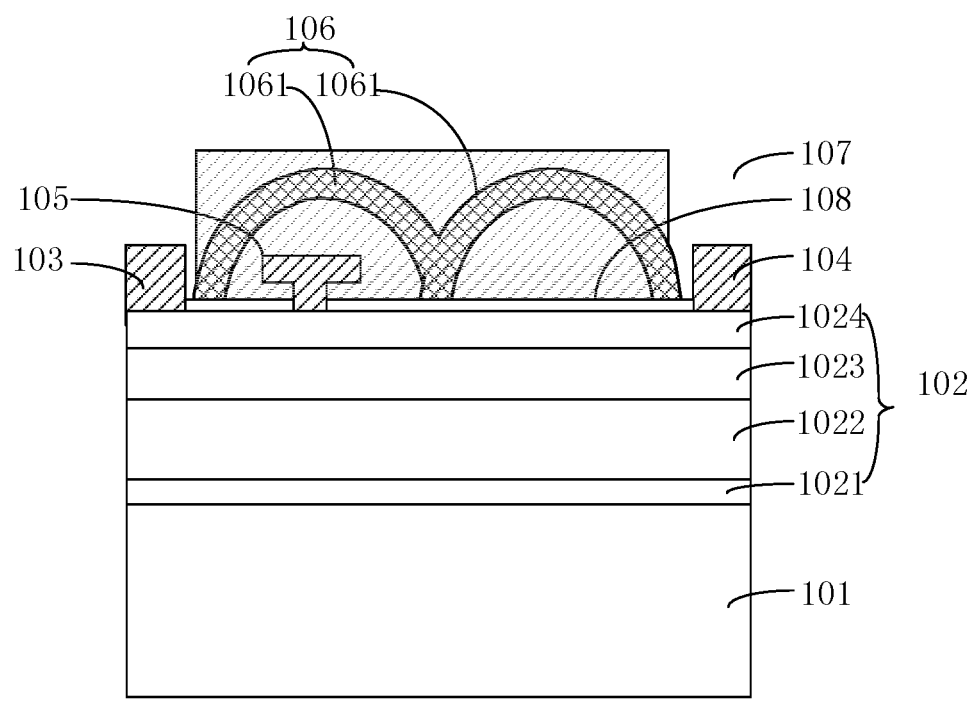
FIG. 4 is a cross-sectional schematic view of another semiconductor device provided by an embodiment of the present disclosure.

It may be appreciated that, as shown in FIG. 4, in another performing form, the isolation structure 106 may include one or more isolation units 1061. When a plurality of isolation units 1061 are included, the plurality of isolation units 1061 are connected in turn and respectively cooperate with the semiconductor layer 102 to form a plurality of chambers, and the gate 105 or a part of the gate 105 is located in one of the chambers. As shown in the figure, only a case of two isolation units 1061 is shown in the figure, and the present application does not limit the specific number of the isolation units 1061.

As the externally applied voltage increases, the strong electric field region on the surface of the device expands from the gate 105 to the drain 104, that is, away from the gate 105, the surface of the device close to the drain 104 also becomes a strong electric field region, so that the air and water vapor in this region will also be ionized. The isolation structure 106 is required to cover the entire strong electric field region; however, if an isolation structure 106 with a large span is used to cover the region between the gate 105 and the drain 104, such an isolation structure 106 is prone to collapse due to the large span. By providing a plurality of isolation units 1061, the span of each isolation unit 1061 is relatively smaller than the span of one isolation structure 106, which reduces the possibility that the large-span isolation structure 106 is easily collapsed, and also covers the entire strong electric field region. Through the chamber formed by each of the plurality of isolation units 1061, the entire strong electric field region is isolated from the outside air and water vapor to avoid the occurrence of a current collapse effect.

It may be appreciated that the chamber formed by the isolation structure 106 and the semiconductor layer 102 is sealed by the sealing structure 107 to form a sealed chamber. The isolation structure 106 may have openings at both ends in the extending direction of the gate 105 during the manufacturing process, and the openings at both ends are sealed by the sealing structure 107 to form a sealed chamber inside the isolation structure 106, wherein the air with a very small dielectric constant can be distributed, so that the chamber can be isolated from the outside air and water vapor, effectively avoiding the air and water vapor ionization on the surface of the device material under a strong electric field that may cause a current collapse effect. The material of the sealing structure 107 may be a highly dense material such as one of a dielectric, a metal, and an organic material or a combination thereof.

Figure 5:
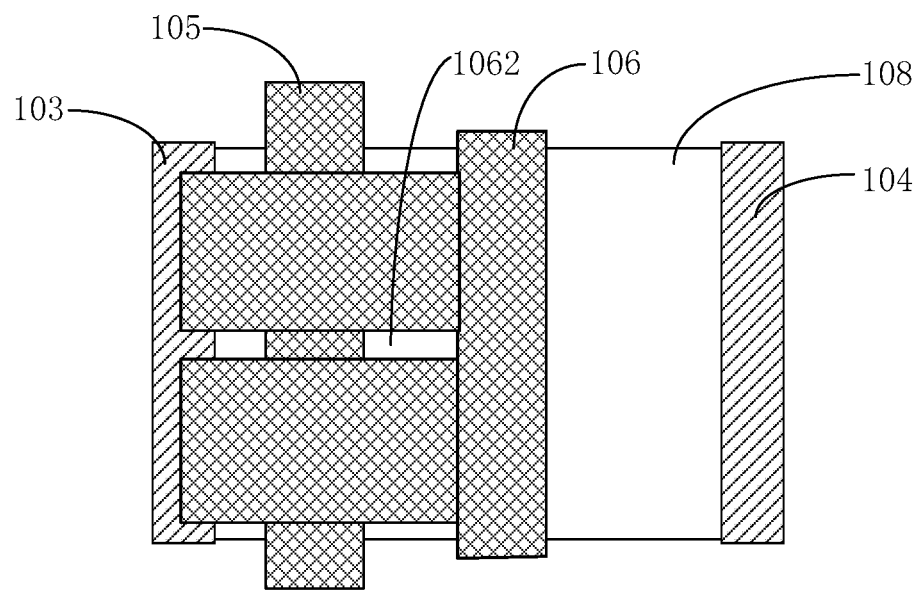
FIG. 5 is a schematic top view of another semiconductor device provided by an embodiment of the present disclosure.

In addition, as shown in FIG. 5, in another performing form, the isolation structure 106 may be set with at least one opening 1062 in a part above the gate 105. Specifically, the isolation structure 106 may be divided into a plurality of segments by the at least one opening 1062 in the length direction of the metal strip of the gate 105 over the gate 105, the gate source region and a part of the gate drain region. The sealing structure 107 is not shown in FIG. 5 for ease of display. After the isolation structure 106 on the gate 105 is divided into a plurality of segments, the parasitic capacitance caused by the isolation structure 106 can be further reduced. Also, the material under the isolation structure 106 can be more easily removed during the manufacturing process of the isolation structure 106. As shown, the part of the isolation structure 106 above the gate 105 can be divided into two segments. In the actual manufacturing process, the width of each segment of the isolation structure 106 can be determined according to actual conditions. The width of each segment of the isolation structure 106 is reasonably set to achieve a better electrical connection effect while avoiding the problem that the metal arch structure is easily collapsed. If each of the isolation structures 106 is too wide, the overlap area of the metal of the isolation structure 106 and the lower gate 105 as well as the two dimensional electron gas conductive channel is limited. In one example, the width of each segment of isolation structure 106 may be in the range of about 1 μm to about 10 μm, and the shape of each segment of the isolation structure 106 may be rectangular or curved.

It may be appreciated that the semiconductor device 100 further includes a first dielectric layer 108 disposed on one side of the semiconductor layer 102 away from the substrate 101 for passivating protection of the semiconductor layer 102.

The first dielectric layer 108 may be formed by depositing a dielectric material on the barrier layer 1024. Passivating protection on the surface of the semiconductor device 100 may be realized by the first dielectric layer 108. The first dielectric layer 108 may adopt one or a combination of materials of SiN, $SiO_2$, SiON, $Al_2O_3$, $HfO_2$, $HfAlO_x$. The specific material of the first dielectric layer 108 is not limited in the embodiment of the present application.

Depositing a dielectric material on the surface of the semiconductor device 100 can passivate the interface state of the material surface and can isolate the outside air and water vapor. The thicker the dielectric material is, the better the isolation effect is. However, the dielectric material may introduce parasitic capacitance. The thicker the dielectric material is, the greater the parasitic capacitance is, which thus affects the high-frequency performance of the device, and the higher the operating frequency of the device is, the more serious the effect is.

In the embodiment of the present application, the isolation structure 106 is provided, and the isolation structure 106 cooperates with the semiconductor layer 102 to form a chamber, and a sealed chamber is formed by the sealing structure 107. When the first dielectric layer 108 is disposed, the thickness of the first dielectric layer 108 within the chamber may be minimized. The parasitic capacitance introduced by the dielectric material is significantly reduced, which may effectively improve the parasitic capacitance effect and improve the high frequency characteristics of the device. When the isolation structure 106 includes a plurality of isolation units 1061, the plurality of isolation units 1061 can cover all of the strong electric field regions so that the thickness of the first dielectric layer 108 on the semiconductor layer 102 can be minimized.

Figure 6:
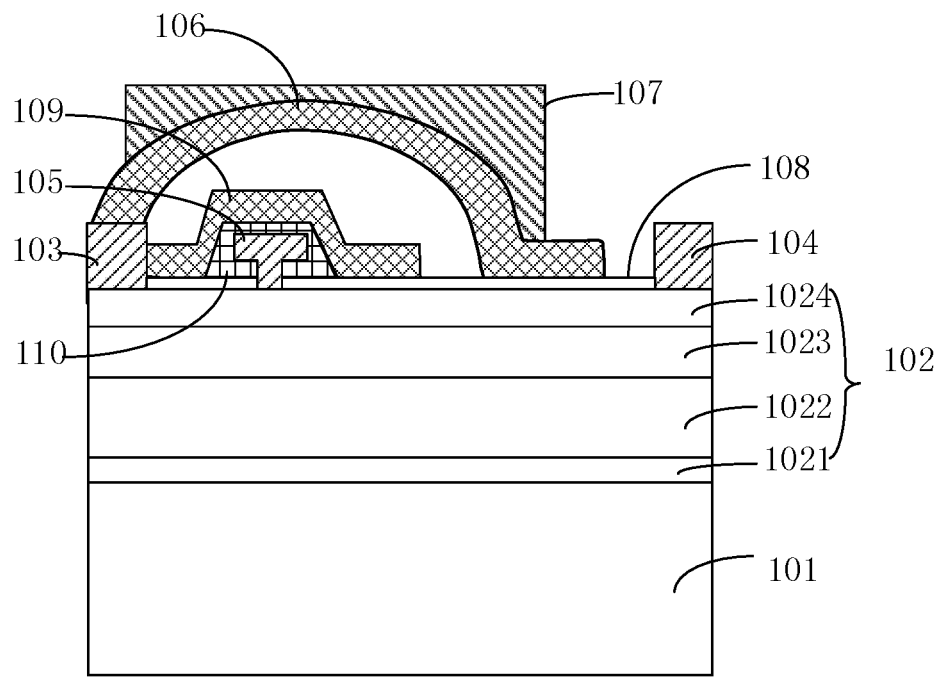
FIG. 6 is a cross-sectional schematic view of another semiconductor device provided by an embodiment of the present disclosure.
Figure 7:
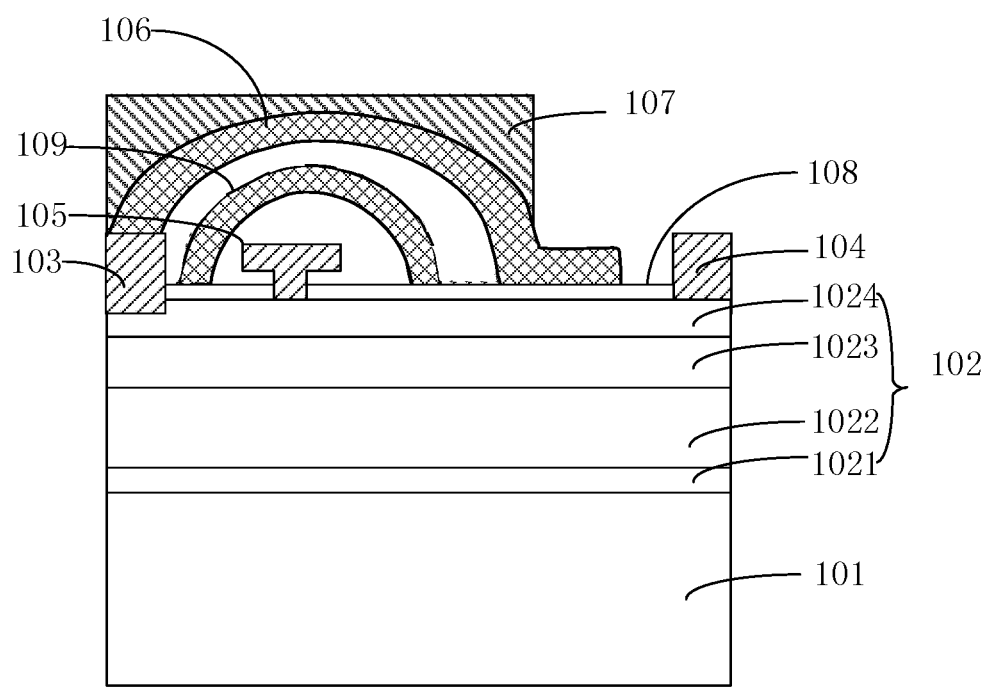
FIG. 7 is a cross-sectional schematic view of another semiconductor device provided by an embodiment of the present disclosure.

Further, as shown in FIG. 6 and FIG. 7, in another performing form, a sub-isolation structure 109 located in the chamber may be disposed between the isolation structure 106 and the gate 105.

As shown in FIG. 7, the sub-isolation structure 109 may be an arched structure, forming a sub-chamber with the semiconductor layer 102, and the gate 105 or a part of the gate 105 is located within the sub-chamber. As shown in FIG. 6, the sub-chamber formed between the sub-isolation structure 109 and the semiconductor layer 102 may also be sealed by the sealing structure 107 to form a sealed sub-chamber. Thus, the sealed chamber structure formed by a multi-layer isolation structure which is formed by the isolation structure 106 and the sub-isolation structure 109 may more effectively optimize the strong electric field distribution in the gate-drain region and increase the sealing and reliability of the strong electric field region.

As shown in FIG. 6 again, the sub-chamber can also be filled with a dielectric material to form the second dielectric layer 110. If the span of the isolation structure 106 is too great, the effect of improving the strong electric field near the end of the metal of the gate 105 close to the drain 104 is limited. At the time, the dielectric material may be firstly deposited to form the second dielectric layer 110, and then the common isolation structure 106 is formed, so that it can effectively optimize the strong electric field distribution in the vicinity of the metal of the gate 105, and then form the sealed chamber structure of the isolation structure 106. Thus, the electric field distribution in the gate drain region can be further optimized, and the air and water vapor in the strong electric field region can be isolated at the same time to improve the current collapse effect. In the embodiment of the present application, a structure with a plurality of or a plurality of layers of sub-isolation structures 109 may be disposed in the isolation structure 106 to form a structure of a plurality of chambers or a plurality of layers of chambers.

Figure 8:
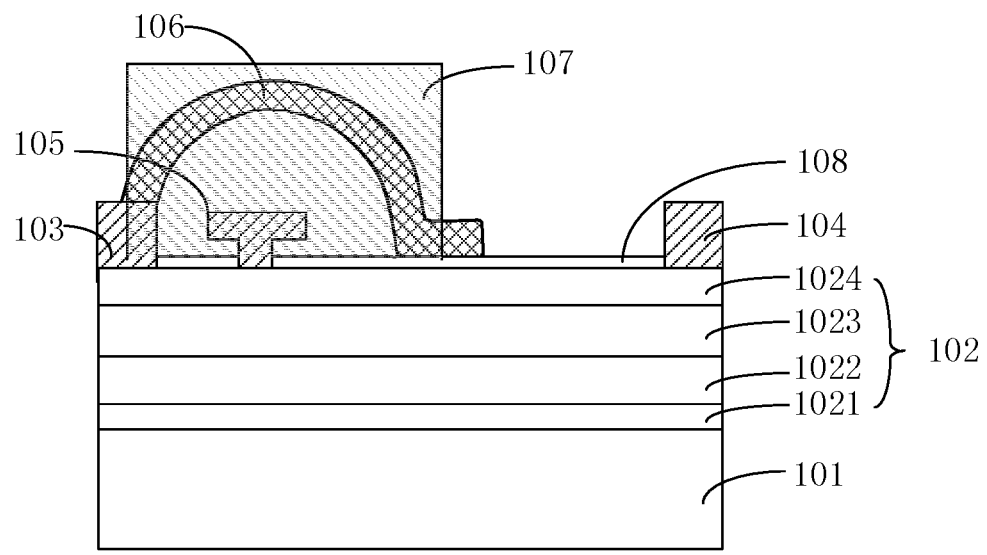
FIG. 8 is a cross-sectional schematic view of another semiconductor device provided by an embodiment of the present disclosure.

It may be appreciated that in another performing form, the isolation structure 106 can be electrically connected to the source 103, or electrically connected to the gate 105, or electrically connected to the drain 104. In the embodiment, the end of the isolation structure 106 disposed at the side close to the source 103 is electrically connected to the source 103 or the gate 105, and the end disposed at the side close to the drain 104 is in direct contact with the device surface layer between the gate 105 and the drain 104 and is not connected to the drain 104. Alternatively, the end of the isolation structure 106 disposed at the side close to the source 103 is not connected to the source 103 or the gate 105, and the end disposed at the side close to the drain 104 is in direct contact with the surface layer of the device between the gate 105 and the drain 104 and is electrically connected to the drain 104. Specifically, in another embodiment, as shown in FIG. 8, the end of the isolation structure 106 close to the source 103 directly covers the side of the source 103 away from the substrate to form an electrical connection contacting directly, and the end disposed on the side close to the drain 104 is in direct contact with the surface layer of the device between the gate 105 and the drain 104, but does not form an electrical connection with the drain. Such a structure can effectively improve the strong electric field distribution on the surface of the device, reduce the electric field peak, improve the current collapse effect, reduce the possibility of device leakage at the same time, and improve the breakdown voltage and reliability of the device.

In the present embodiment, the height of the sealing structure 107 needs to be greater than the maximum height L of the isolation structure 106 in the direction away from the semiconductor layer. The height of the sealing structure 107 may be equal to or greater than 1.2L, which can more effectively ensure the sealing property of the arch isolation structure and the adhesion with the isolation structure 106. In the direction extending from the source 103 to the drain 104, as shown in FIG. 8, the distance between the inner wall of the isolation structure 106 in contact with the surface layer of the device and the source 103 is a, and the distance between the outer wall in contact with the surface layer of the device and the source 103 is b, so the width of the sealing structure 107 in the direction extending from the source 103 to the drain 104 needs to be equal to or greater than (a+b)/2 to improve the sealing stability of the device during use.

In summary, in the embodiment of the present application, the sealed chamber structure formed by the disposed isolation structure 106 and the sealing structure 107 has a high sealability, which can well isolate the outside air and water vapor, and may effectively avoid the air and water vapor ionization on the surface of the device material under strong electric field which may cause a current collapse effect. Moreover, the thickness of the dielectric layer on the material surface of the device inside the chamber of the isolation structure 106 can be significantly reduced, and the gate 105 and the isolation structure 106 are separated from the surface of the device by using air having a very small dielectric constant, which significantly reduces the parasitic capacitance, effectively improve the parasitic capacitance effect and improve the high frequency characteristics of the device. The structure using such a semiconductor device 100 is simple in manufacturing process and high in reliability.

Figure 9:
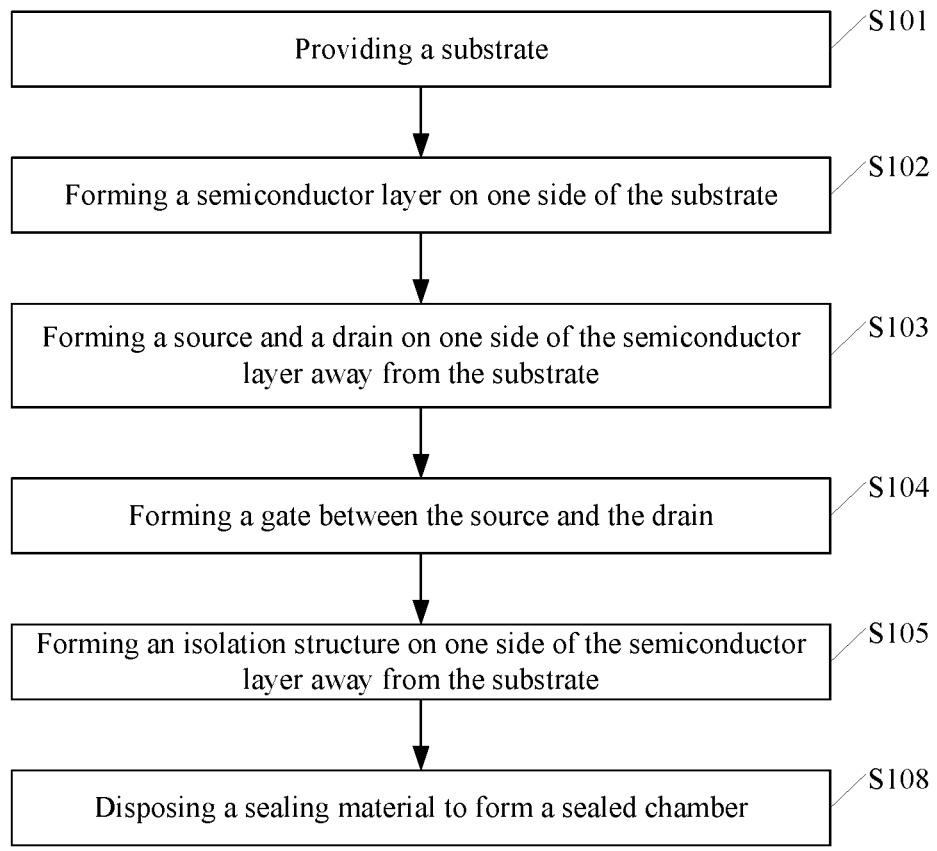
FIG. 9 is a schematic flow chart of a method for manufacturing a semiconductor device provided by an embodiment of the present disclosure.

The embodiment of the present application further provides a method for manufacturing the above semiconductor device 100. As shown in FIG. 9, the method may include:

step S101 of providing a substrate 101;

step S102 of forming a semiconductor layer 102 on one side of the substrate 101;

step S103 of forming a source 103 and a drain 104 on one side of the semiconductor layer 102 away from the substrate 101;

step S104 of forming a gate 105 between the source 103 and the drain 104; and step S105 of forming an isolation structure 106 on one side of the semiconductor layer 102 away from the substrate 101, wherein one end of the isolation structure 106 disposed at a side close to the source 103 forms an electrical connection with the source 103 or the gate 105, and the other end is disposed at a side close to the drain 104 and in direct contact with the surface layer of the device, to cover the gate 105 or a part of the gate 105, wherein the isolation structure 106 is an integrally formed structure and cooperates with the semiconductor layer 102 to form a chamber, and at least a part of the gate 105 is located within the chamber.

At step S108, a sealing structure is disposed to seal an opening of the chamber in the gate extending direction to form a sealed chamber. The material of the sealing structure used in step S108 may be a semiconductor oxide material such as a dielectric, indium tin oxide, indium zinc oxide or indium oxide, or Bisbenzocyclobutene Resins (BCB), Methylsilsesquioxane (MSQ) or a combination thereof. At step S108, a sealing structure 107 is formed to seal the opening of the isolation structure 106 to form a sealed chamber. The sealing structure 107 is disposed so that the height thereof is equal to or greater than 1.2L, and the width in the direction extending from the source 103 to the drain 104 is equal to or greater than (a+b)/2.

Specifically, the method for forming the semiconductor layer 102, the source 103, the drain 104, and the gate 105 on the substrate 101 can be performed by a known conventional process, and details shall not be further described herein.

In the process of forming the isolation structure 106, the following can be included.

Figure 10:
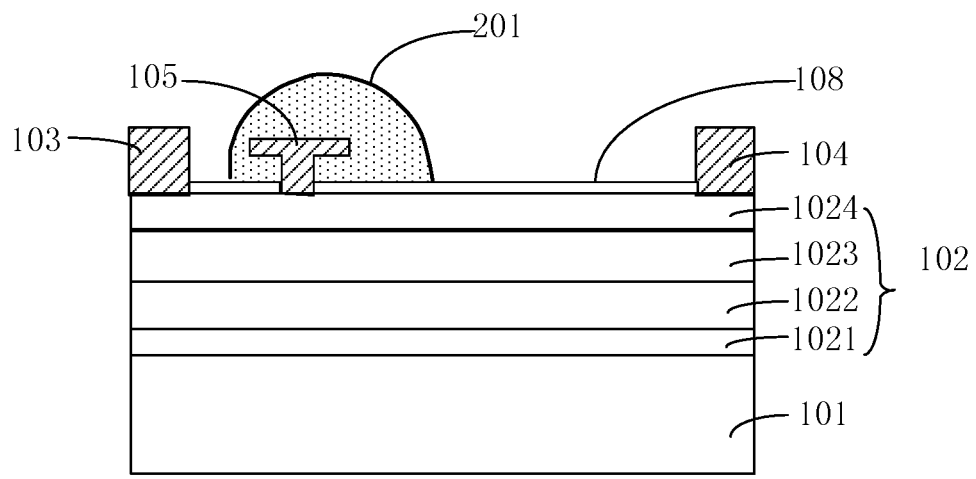
FIGS. 10 to 14 are cross-sectional schematic views of the semiconductor device in each flow in the manufacturing method.

As shown in FIG. 10, a support structure 201 is formed on one side of the semiconductor layer 102 away from the substrate 101, the support structure 201 covering at least a part of the gate 105.

Before the isolation structure 106 is formed, the support structure 201 may be formed according to the specific structure of the isolation structure 106 that needs to be formed. For example, if the end of the isolation structure 106 to be formed disposed on one side close to the source 103 needs to be connected to the source 103, the support structure 201 needs to completely cover the region between the source 103 and the gate 105 to ensure that when the isolation structure 106 is subsequently formed, one end of the isolation structure 106 disposed at one side close to the source 103 may be connected to the source 103. On the other hand, if one end of the isolation structure 106 to be formed disposed on one side close to the source 103 does not need to be connected to the source 103, the support structure 201 cannot completely cover the region between the source 103 and the gate 105, and it needs to reserve a certain distance from the source 103.

The support structure 201 in the embodiment of the present application may be formed by using a photoresist, and a photoresist supporting the isolation structure 106 is formed in the gate 105, the gate source region and a part of the gate drain region by a photolithography process, and the photoresist is baked to form the support structure 201. The space occupied by the support structure 201 is actually the space in which the chamber formed by the isolation structure 106 is located. For example, the photoresist may be baked into an arch shape, and the isolation structure 106 formed subsequently is arched. The present application does not limit the specific structure of the support structure 201.

Figure 11:
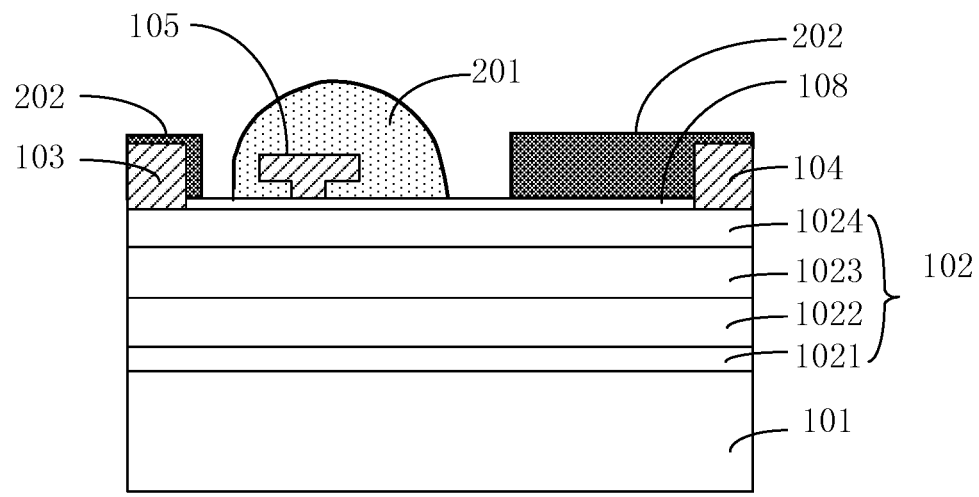

As shown in FIG. 11, a shielding structure 202 is formed on the semiconductor layer 102 in a region where the isolation structure 106 is not covered.

By forming the shielding structure 202 on the semiconductor layer 102 in a region where the isolation structure 106 is not required to be formed, it is possible to shield the regions where the isolation structure 106 is not required to be formed when the isolation structure 106 is formed, and to prevent the material, from which the isolation structure 106 is formed, from being formed in these regions.

As previously mentioned, the specific arrangement of the shielding structure 202 still needs to be determined according to the structure of the isolation structure 106 that needs to be formed. For example, if one end of the isolation structure 106 to be formed disposed on one side close to the source 103 needs to be in direct contact with the surface of the source 103, the shielding structure 202 does not have to be formed in the gate source region. Furthermore, if one end of the isolation structure 106 to be formed disposed on one side close to the source 103 does not need to be in direct contact with the surface of the source 103, as shown in the figure, a shielding structure 202 needs to be formed on the source 103, and the shielding structure 202 may be formed after the support structure 201 is formed. The source 103 is partially shielded to avoid the material forming the isolation structure 106 from being in contact with the source 103.

In the process of manufacturing the isolation structure 106, the isolation structure 106 needs to be electrically connected to the source 103, or electrically connected to the gate 105, or electrically connected to the drain 104 by a conductive material or in form of contact by directly covering.

The material of the shielding structure 202 may also be a photoresist or other materials. The embodiment of the present application does not limit the specific material thereof. The shape of the support structure 201 may be adjusted by adjusting the photolithography process and the baking conditions, so as to design support structures 201 of different shapes. By designing the layout, shielding structures 202 of different shapes may be formed, thereby manufacturing isolation structures 106 with different structures.

Figure 12:
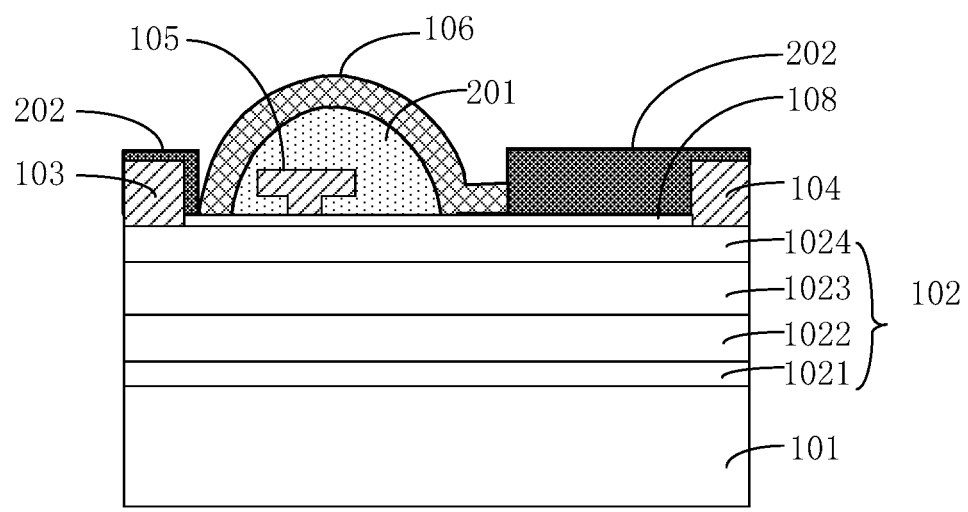

As shown in FIG. 12, an isolation structure 106 is formed on the support structure 201 so that the isolation structure 106 covers the gate 105 or a part of the gate 105.

Figure 13:
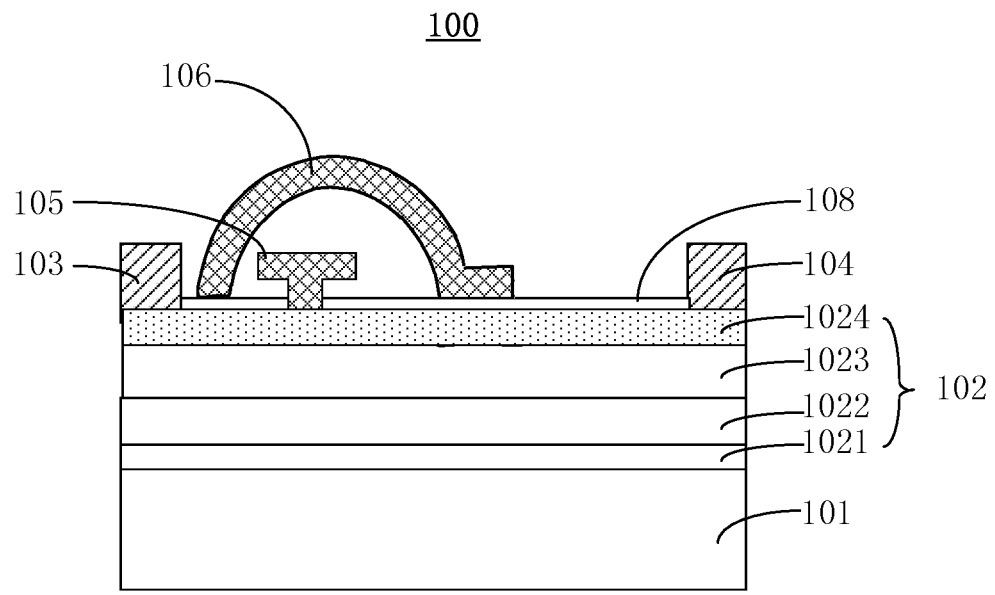
Figure 14:
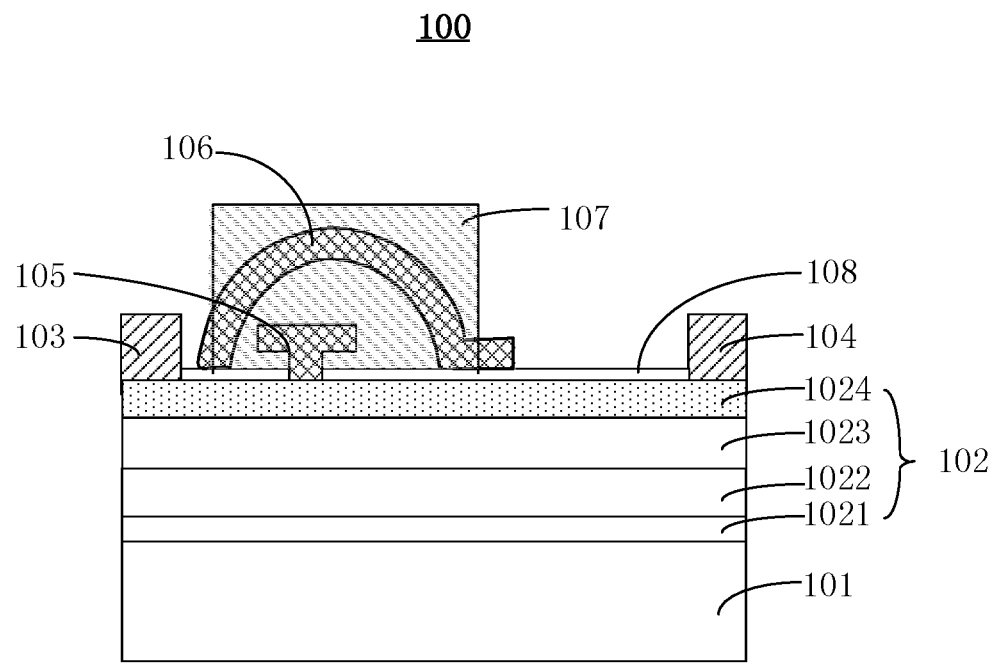

For convenience of display, only the case where the isolation structure 106 is not in direct contact with the surface of the source 103 is illustrated in FIGS. 12 to 14. The present application does not limit it. After the support structure 201 and the shielding structure 202 are formed according to the structure of the isolation structure 106, the isolation structure 106 can be formed. The isolation structure 106 may be formed by a process in one-time. In the process of forming the isolation structure 106, if metal is used, a metal plating process, a metal evaporation process, or a metal sputtering process, or a combination thereof may be used. As shown in FIG. 13, the support structure 201 and the shielding structure 202 are removed.

Step S108 of providing the sealing structure may include the following.

As shown in FIG. 14 (a cross-sectional schematic view at the opening of the isolation structure in the extending direction from the source 103 to the drain 104), a sealing structure 107 is disposed to seal openings at two ends of the isolation structure 106 in the extending direction of the gate 105 to seal the chamber formed between the isolation structure 106 and the semiconductor layer 102.

After the isolation structure 106 is formed, the support structure 201 and the shielding structure 202 may be removed.

It may be appreciated that, prior to step of forming the gate 105 between the source 103 and the drain 104, the method further includes:

step S106, in which the first dielectric layer 108 is formed on one side of the semiconductor layer 102 away from the substrate 101; and step S107, in which a trench corresponding to the gate 105 is provided on the first dielectric layer 108 to form the gate 105 in the trench.

In the process of manufacturing the semiconductor device 100, a dielectric layer may be formed on the semiconductor layer 102 for passivation protection of the semiconductor layer 102. Therefore, after the first dielectric layer 108 is disposed, in the process of forming the gate 105, a trench corresponding to the gate 105 is firstly formed on the first dielectric layer 108 to facilitate the subsequent formation of the gate 105.

Further, the step of forming the support structure 201 on one side of the semiconductor layer 102 away from the substrate 101 includes depositing a second dielectric layer 110 on the gate 105, forming a sub-isolation structure 109 on the second dielectric layer 110, and forming the support structure 201 on the sub-isolation structure 109.

As described above, in a performing form, a sub-isolation structure 109 located in the chamber may further be disposed between the isolation structure 106 and the gate 105, and the sub-isolation structure 109 and the semiconductor layer 102 form a sub-chamber in which the gate 105 or a part of the gate 105 is located. In forming the sub-isolation structure 109, the second dielectric layer 110 may be formed firstly, and then the sub-isolation structure 109 may be formed on the second dielectric layer 110. This can effectively optimize the strong electric field distribution in the vicinity of the metal of the gate 105, and then form the sealed chamber structure of the isolation structure 106, which can further optimize the electric field distribution in the gate drain region, and simultaneously isolate the air and water vapor in the strong electric field region and improve the current collapse effect.

It may be appreciated that a support structure 201 corresponding to the sub-isolation structure 109 may be formed firstly, and a sub-isolation structure 109 may be formed on the support structure 201. After the isolation structure 106 is formed, the support structure 201 in the sub-isolation structure 109 is removed and sealed, so that the sub-isolation structure 109 forms a sealed chamber. Thus, through a multi-layer isolation structure sealed chamber structure is formed by the isolation structure 106 and the sub-isolation structure 109, the strong electric field distribution in the gate drain region can be more effectively optimized and the sealing and reliability of the strong electric field region can be increased.

Further, in another performing form, the isolation structure 106 may include a plurality of isolation units 1061, and the step of forming the support structure 201 on one side of the semiconductor layer 102 away from the substrate 101 may also include forming a plurality of support structures 201 on one side of the semiconductor layer 102 away from the substrate 101, wherein one of the support structures 201 covers at least a part of the gate 105.

As described in the structure performing form, as the externally applied voltage increases, the strong electric field region on the surface of the device expands from the gate 105 to the drain 104, that is, the surface of the device away from the gate 105 and close to the drain 104 also becomes a strong electric field region, so that the air and water vapor in this region will also be ionized. At the time, this problem is improved by disposing a plurality of isolation units 1061. When it is necessary to form a plurality of isolation units 1061, it is necessary to firstly form support structure 201 corresponding to each of the plurality of isolation units 1061 correspondingly. Thereby, the purpose that the isolation structure 106 covers the entire strong electric field region is achieved.

Correspondingly, the step S105 of forming the isolation structure 106 on the support structure 201 is specifically to form a plurality of isolation units 1061 connected in turn on the plurality of support structures 201 to form the isolation structure 106.

In another performing form, prior to the step of removing the support structure 201 and the shielding structure 202, the method may further include forming at least one opening in the isolation structure 106 above the gate 105 (i.e., an opening 1062 as shown in FIG. 5) to divide the part of the isolation structure 106 above the gate 105 into a plurality of segments.

As such, the isolation structure 106 located above the gate 105 is divided into a plurality of segments, and the parasitic capacitance caused by the isolation structure 106 may be further reduced. The specific setting form may refer to the description of the above structure performing form, and details will not be described herein again.

The above description refers only to example embodiments of the present disclosure, and is not intended to limit the present disclosure. Various modifications and changes may be made to the present disclosure for those skilled in the art. Any modifications, equivalent substitutions, improvements, etc. made within the spirit and scope of the present disclosure should be included within the scope of the present disclosure. It should be noted that similar reference numerals and letters indicate similar items in the following figures, and therefore, once an item is defined in a figure, it is not necessary to further define and explain it in the subsequent figures. The above is only specific embodiments of the present disclosure, but the scope of the present disclosure is not limited thereto. Any person skilled in the art can easily conceive of changes or substitutions within the technical scope disclosed by the present disclosure which should be covered by the protection scope of the present disclosure. Therefore, the protection scope of the disclosure should be determined by the scope of the claims.

The invention claimed is:

1. A semiconductor device comprising:
a substrate;
a semiconductor layer located on one side of the substrate;
a source and a drain located on one side of the semiconductor layer away from the substrate, and a gate located between the source and the drain; and
an isolation structure disposed on one side of the semiconductor layer away from the substrate, one end of the isolation structure disposed at a side close to the source, and the other end disposed at a side close to the drain and in direct contact with a surface layer of the semiconductor device, the isolation structure covering the gate or a part of the gate, the isolation structure being an integrally formed structure and forming a chamber with the semiconductor layer, at least one part of the gate located in the chamber, the chamber having an opening at an end of the isolation structure along a gate extending direction and in a location where the isolation structure is overlapped with the gate forming a sealed chamber by sealing at the opening using a sealing structure;
wherein the gate extending direction is parallel with a plane direction of the semiconductor layer; and
wherein one end of the isolation structure at a side close to the source forms an electrical connection with one of the source and the gate.

2. The semiconductor device according to claim 1, wherein a height of the sealing structure is greater than a maximum height L of the isolation structure in a direction away from the semiconductor layer.

3. The semiconductor device according to claim 1, wherein a material of the isolation structure is a metallic material.

4. The semiconductor device according to claim 3, wherein one end of the isolation structure at a side close to the source is in direct contact with the source, and covers one side of the source away from the substrate.

5. The semiconductor device according to claim 1, wherein the isolation structure comprises a plurality of isolation units, which are connected in turn and respectively cooperate with the semiconductor layer to form a plurality of chambers, and the gate or a part of the gate is located in one of the chambers.

6. The semiconductor device according to claim 4, wherein the isolation structure is set with at least one opening in a part above the gate.

7. The semiconductor device according to claim 1, wherein the semiconductor device further comprises a first dielectric layer disposed on one side of the semiconductor layer away from the substrate.

8. The semiconductor device according to claim 1, wherein, in the chamber, a sub-isolation structure located within the chamber is further disposed between the isolation structure and the gate, wherein the sub-isolation structure cooperates with the semiconductor layer to form a sub-chamber, and wherein the gate or a part of the gate is located within the sub-chamber.

9. The semiconductor device according to claim 8, wherein the sub-chamber is filled with a dielectric material to form a second dielectric layer.

10. A method for manufacturing a semiconductor device, the method comprising:
providing a substrate;
forming a semiconductor layer on one side of the substrate;
forming a source and a drain on one side of the semiconductor layer away from the substrate;
forming a gate between the source and the drain;
forming an isolation structure on one side of the semiconductor layer away from the substrate, so that one end of the isolation structure is disposed at a side close to the source, and the other end is disposed at a side close to the drain and in direct contact with a surface layer of the semiconductor device, to cover the gate or a part of the gate, wherein the isolation structure is an integrally formed structure and forms a chamber with the semiconductor layer, and wherein at least a part of the gate is located within the chamber; and disposing a sealing structure to seal an opening of the chamber to form a sealed chamber, the opening being at an end of the isolation structure along a gate extending direction and in a location where the isolation structure is overlapped with the gate;

wherein the gate extending direction is parallel with a plane direction of the semiconductor layer; and wherein one end of the isolation structure at a side close to the source forms an electrical connection with one of the source and the gate.

11. The method according to claim 10, wherein, prior to the step of forming a gate between the source and the drain, the method further comprises:

forming a first dielectric layer on one side of the semiconductor layer away from the substrate; and forming a trench corresponding to the gate on the first dielectric layer to form the gate in the trench.

12. The method according to claim 10, wherein the step of forming an isolation structure on one side of the semiconductor layer away from the substrate comprises:

forming a support structure on one side of the semiconductor layer away from the substrate, the support structure covering at least one part of the gate;

forming a shielding structure in a region of the semiconductor layer that is not covered by the isolation structure;

integrally forming the isolation structure on the support structure so that the isolation structure covers the gate or a part of the gate; and removing the support structure and the shielding structure; and wherein the step of disposing a sealing structure comprises:

sealing an opening of the isolation structure at both ends in the gate extending direction with the sealing structure to seal a chamber formed between the isolation structure and the semiconductor layer.

13. The method according to claim 12, wherein the step of forming a support structure on one side of the semiconductor layer away from the substrate comprises:

depositing a second dielectric layer on the gate;

forming a sub-isolation structure on the second dielectric layer; and forming the support structure on the sub-isolation structure.

14. The method according to claim 12, wherein the isolation structure comprises a plurality of isolation units, and wherein the step of forming a support structure on one side of the semiconductor layer away from the substrate comprises:

forming a plurality of support structures on one side of the semiconductor layer away from the substrate, wherein one of the support structures covers at least a part of the gate; and the step of forming the isolation structure on the support structure comprises:

forming a plurality of isolation units connected in turn on a plurality of support structures to form the isolation structure.

15. The method according to claim 12, wherein, prior to the step of removing the support structure and the shielding structure, the method further comprises:

forming at least one opening in a part of the isolation structure located above the gate.

16. The semiconductor device according to claim 1, wherein the isolation structure is set with at least one opening in a part above the gate.

* * * * *

UNITED STATES PATENT AND TRADEMARK OFFICE
CERTIFICATE OF CORRECTION

| | |
|---|---|
| PATENT NO. | : 10,749,005 B1 |
| APPLICATION NO. | : 16/080223 |
| DATED | : August 18, 2020 |
| INVENTOR(S) | : Yi Pei et al. |

Page 1 of 1

It is certified that error appears in the above-identified patent and that said Letters Patent is hereby corrected as shown below:

On the Title Page

Item [30], insert therefor -- March 30, 2017 (CN) 201710202132.6 --.

In the Specification

Column 3, Line 57, delete "line AN in" and insert therefor -- line AA' in --.
Column 5, Line 46, delete "line AN in" and insert therefor -- line AA' in --.

Signed and Sealed this
Fifteenth Day of December, 2020

Andrei Iancu
*Director of the United States Patent and Trademark Office*